US012756399B2

(12) United States Patent
Wu et al.

(10) Patent No.: US 12,756,399 B2
(45) Date of Patent: Oct. 6, 2026

(54) VOLTAGE-CONTROLLED OSCILLATOR AND PHASE-LOCKED LOOP

(71) Applicant: REALTEK SEMICONDUCTOR CORPORATION, Hsinchu (TW)

(72) Inventors: Kuo-Wei Wu, Hsinchu (TW); Yen-Ju Lin, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 149 days.

(21) Appl. No.: 18/822,516

(22) Filed: Sep. 3, 2024

(65) Prior Publication Data

US 2025/0096808 A1 Mar. 20, 2025

(30) Foreign Application Priority Data

Sep. 19, 2023 (TW) ................................ 112135758

(51) Int. Cl.
*H03L 7/099* (2006.01)
*H03L 7/089* (2006.01)
*H03L 7/093* (2006.01)

(52) U.S. Cl.
CPC .......... *H03L 7/0995* (2013.01); *H03L 7/0891* (2013.01); *H03L 7/093* (2013.01)

(58) Field of Classification Search
CPC ...... H03L 7/0891; H03L 7/093; H03L 7/0995
See application file for complete search history.

(56) References Cited

U.S. PATENT DOCUMENTS 10,333,530 B1 * 6/2019 Katsuragi ............... H03L 7/093
2012/0223781 A1 * 9/2012 Chen ..................... H03L 7/0995 331/108 D
2012/0256693 A1 10/2012 Raghunathan et al.
2019/0140652 A1 5/2019 Tsai et al.
2024/0007114 A1 * 1/2024 Shih ......................... H03K 5/01

FOREIGN PATENT DOCUMENTS

CN 115412090 A 11/2022

OTHER PUBLICATIONS

OA letter of a counterpart TW application (appl. No. 112135758) mailed on Jun. 4, 2024.

* cited by examiner

*Primary Examiner* — Patrick O Neill
(74) *Attorney, Agent, or Firm* — WPAT, PC

(57) ABSTRACT

A voltage-controlled oscillator includes an input circuit, a first current supply circuit, a second current supply circuit, a filtering circuit, and an oscillating circuit. The input circuit includes an operational amplifier and a first input transistor. The operational amplifier generates an output voltage according to an input voltage and a feedback voltage. The first input transistor generates an input current according to the output voltage and a power supply voltage. The first current supply circuit generates a first output current according to the input current. The second current supply circuit generates a second output current according to the input current. The filtering circuit couples to the input circuit and the second current supply circuit, and decrease an influence caused by a variation of the input current on the second current supply circuit. The oscillating circuit generates an output clock according to the first output current and the second output current.

13 Claims, 4 Drawing Sheets

VOLTAGE-CONTROLLED OSCILLATOR AND PHASE-LOCKED LOOP

BACKGROUND OF THE INVENTION

1. Field of the Invention

The present disclosure relates to a voltage-controlled oscillator and a phase-locked loop, especially to a voltage-controlled oscillator and a phase-locked loop utilizing the voltage-controlled oscillator.

2. Description of Related Art

Voltage-controlled oscillators with high-gain are more resilient to influences of manufacturing process, temperature, and voltage variations. However, with increasingly stringent jitter requirements for product specifications, the voltage-controlled oscillators require with high-gain need large loop filters to meet the jitter requirements. The loop filters may even need to be implemented by utilizing external capacitors, which increases circuit area and cost.

In addition, in a voltage-controlled oscillator, transistors can be utilized to convert an input voltage into a current so as to control the oscillation frequency of the voltage-controlled oscillator. However, based on the characteristics of the transistors, the input voltage needs to be at least larger than the threshold voltage (Vth) of the transistors, and the input voltage is therefore limited such that the voltage operating range of the phase-locked loop utilizing the voltage-controlled oscillator is consequently affected. Furthermore, if the current source of the voltage-controlled oscillator is implemented by utilizing transistors, it becomes sensitive to jitters of the power supply. As a result, the voltage-controlled oscillator has higher requirements for the power supply. For example, the power supply with lower noise is therefore needed.

Furthermore, when a phase-locked loop utilizing a voltage-controlled oscillator is activated, the internal capacitor and the internal resistor significantly impact the stability of the phase-locked loop. Therefore, compensation circuits are usually utilized for compensation. However, the compensation circuits result in additional power consumption. Besides, in the steady state, the assistance provided by the compensation circuits to the voltage-controlled oscillator is minimal. Additionally, the transistors in the compensation circuits generate poles during operations, which significantly affects the stability of the phase-locked loop. Moreover, different frequencies affect the corner frequency of the voltage controlled (VC) circuit. Therefore, not only of transistors in the voltage-controlled oscillator should be considered, but also resistors should be considered, such that the complexity of circuit design increases.

SUMMARY OF THE INVENTION

In some aspects, an object of the present disclosure is to, but not limited to, provides a voltage-controlled oscillator and a phase-locked loop that makes an improvement to the prior art.

An embodiment of a voltage-controlled oscillator of the present disclosure includes an input circuit, a first current supply circuit, a second current supply circuit, a filtering circuit, and an oscillating circuit. The input circuit includes an operational amplifier and a first input transistor. The operational amplifier is configured to generate an output voltage according to an input voltage and a feedback voltage. The first input transistor is configured to generate an input current according to the output voltage and a power supply voltage. The first current supply circuit is configured to generate a first output current according to the input current. The second current supply circuit is configured to generate a second output current according to the input current. The filtering circuit is coupled to the input circuit and the second current supply circuit, and configured to reduce an influence caused by a variation of the input current on the second current supply circuit. The oscillating circuit is configured to generate an output clock according to the first output current and the second output current.

An embodiment of a phase-locked loop of the present disclosure includes a phase-frequency detector, a charge pump, a first filtering circuit, a voltage-controlled oscillator, and a loop divider. The phase-frequency detector is configured to detect a difference between a reference clock and a feedback clock to output a detection signal. The charge pump is configured to generate a charging/discharging signal according to the detection signal. The first filtering circuit is configured to determine an input voltage according to the charging/discharging signal. The voltage-controlled oscillator includes an input circuit, a first current supply circuit, a second current supply circuit, a second filtering circuit, and an oscillating circuit. The input circuit includes an operational amplifier and a first input transistor. The operational amplifier is configured to generate an output voltage according to the input voltage and a feedback voltage. The first input transistor is configured to generate an input current according to the output voltage and a power supply voltage. The first current supply circuit is configured to generate a first output current according to the input current. The second current supply circuit is configured to generate a second output current according to the input current. The second filtering circuit is coupled to the input circuit and the second current supply circuit and configured to reduce an influence caused by a variation of the input current on the second current supply circuit. The oscillating circuit is configured to generate an output clock according to the first output current and the second output current. The loop divider is configured to generate the feedback clock according to the output clock. A ratio of a filter bandwidth of the second filtering circuit to a loop bandwidth of the phase-locked loop is not larger than 0.01.

Technical features of some embodiments of the present disclosure make an improvement to the prior art. The voltage-controlled oscillator of the present disclosure utilizes the operational amplifier to receive the input voltage. Through the negative feedback mechanism of the operational amplifier, low input voltage can be used to adjust the transistor for generating the current to control the oscillating frequency of the oscillator. As a result, the voltage-controlled oscillator of the present disclosure has a wider input voltage range, and the phase-locked loop utilizing the voltage-controlled oscillator has a broader voltage operating range as well.

Additionally, the voltage-controlled oscillator and the phase-locked loop of the present disclosure utilize the negative feedback mechanism of the operational amplifier to adjust the transistor. Consequently, the voltage-controlled oscillator and the phase-locked loop of the present disclosure have a superior power supply rejection ratio (PSRR), and requirements to the power supply are therefore lower. Furthermore, in the circuit design of the voltage-controlled oscillator and the phase-locked loop of the present disclosure, only the impact of the transistor on the corner frequency needs to be considered, without the need to account for the influence of the resistor. As a result, the complexity of the circuit design decreases.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

In order to improve a voltage operating range of a phase-locked loop utilizing a voltage-controlled oscillator being affected by limitations in an input voltage of a voltage-controlled oscillator in prior art, to improve higher power supply requirements associated with the voltage-controlled oscillator in prior art, and to improve higher complexity in a circuit design in prior art, the present disclosure provides a voltage-controlled oscillator and a phase-locked loop, which will be explained in detail as below.

Figure 1:
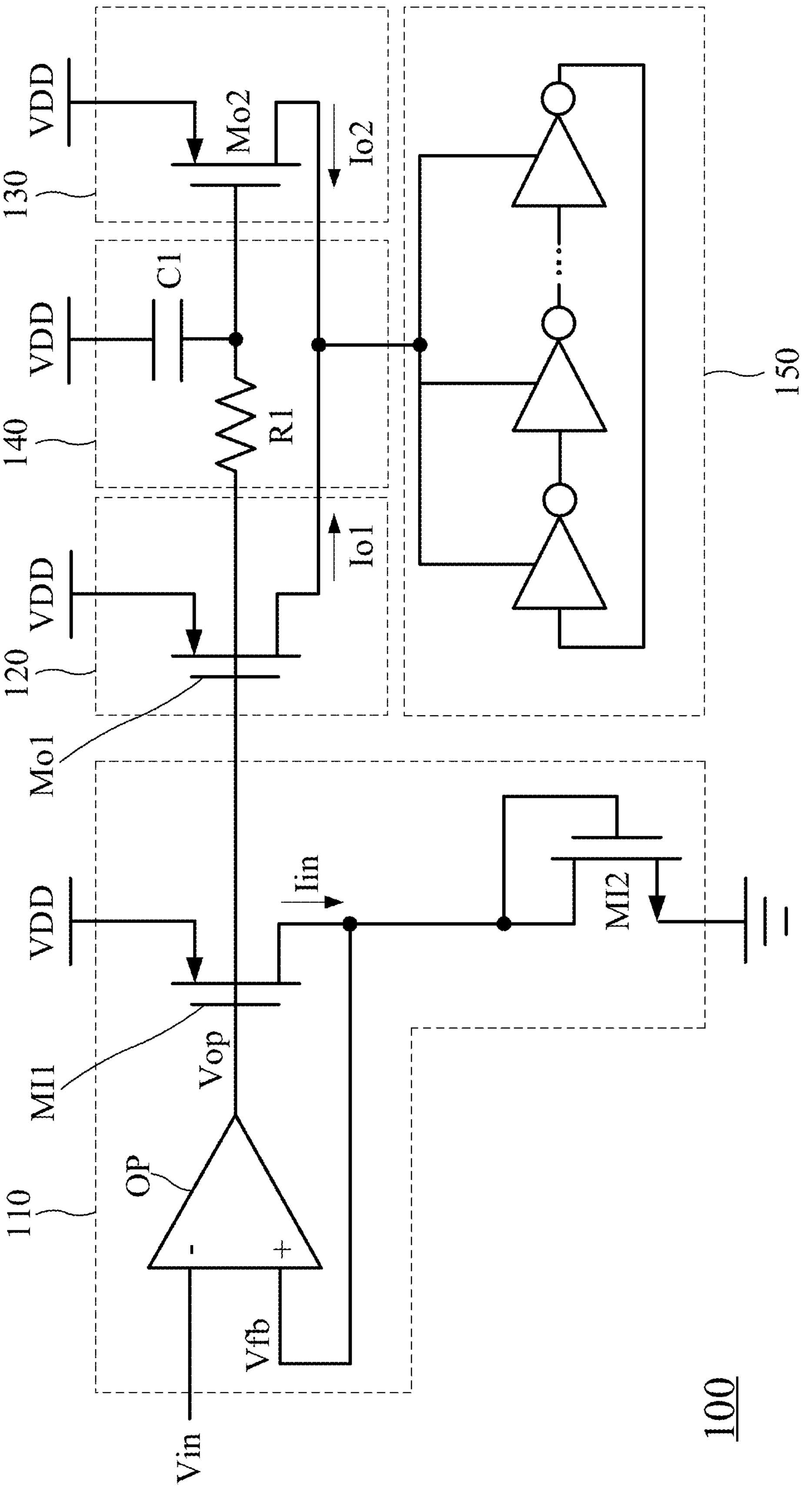
FIG. 1 shows an embodiment of a voltage-controlled oscillator of the present disclosure.

FIG. 1 shows an embodiment of a voltage-controlled oscillator 100 of the present disclosure. As shown in the figure, the voltage-controlled oscillator 100 includes an input circuit 110, a first current supply circuit 120, a second current supply circuit 130, a filtering circuit 140, and an oscillating circuit 150. The input circuit 110 includes an operational amplifier OP and a first input transistor MI1. The operational amplifier OP is coupled to the first input transistor MI1, the first current supply circuit 120, and the filtering circuit 140, and coupled to the second current supply circuit 130 through the filtering circuit 140. The first current supply circuit 120 and the second current supply circuit 130 are coupled to the oscillating circuit 150.

In some embodiments, the operational amplifier OP is configured to generate an output voltage Vop according to an input voltage Vin and a feedback voltage Vfb. Subsequently, the first input transistor MI1 is configured to generate an input current Iin according to the output voltage Vop and a power supply voltage VDD. The first current supply circuit 120 is configured to generate a first output current Io1 according to the input current Iin. The second current supply circuit 130 is configured to generate a second output current Io2 according to the input current Iin. The filtering circuit 140 is coupled to the input circuit 110 and the second current supply circuit 130, and configured to reduce an influence caused by a variation of the input current Iin on the second current supply circuit 130. In some embodiments, the filtering circuit 140 includes a passive low-pass filter, and the filtering circuit 140 includes a capacitor C1 and a resistor R1. The filtering circuit 140 of the present disclosure can be disposed between the input circuit 110 and the second current supply circuit 130 to reduce (e.g., slow down) an influence caused by a variation of the input current Iin on the second current supply circuit 130 with a higher current driving ability. The oscillating circuit 150 is configured to generate an output clock according to the first output current Io1 and the second output current Io2.

It is noted that, if viewed from the input voltage Vin, the voltage-controlled oscillator 100 of the present disclosure resembles an architecture of a low dropout regulator (LDO). Through the negative feedback mechanism of the operational amplifier OP, a lower input voltage Vin can be used to adjust the gate-source voltage (Vgs) of the first input transistor MI1 for generating a current to control the oscillation frequency of the oscillating circuit 150. As a result, the voltage-controlled oscillator 100 of the present disclosure has a wider input voltage Vin range, and the phase-locked loop utilizing the voltage-controlled oscillator 100 has a broader voltage operating range as well.

In some embodiments, the second output current Io2 generated by the second current supply circuit 130 is larger than the first output current Io1 generated by the first current supply circuit 120. As a result, the current driving ability of the second current supply circuit 130 is stronger than the current driving ability of the first current supply circuit 120. For example, the current ratio of the second output current Io2 to the first output current Io1 can be a value ranging from 10 to 40. The filtering circuit 140 is coupled between the input circuit 110 and the second current supply circuit 130 for slowing down an influence caused by a variation of the input current Iin on the second current supply circuit 130 with a higher current driving ability so as to reduce an influence caused by a variation of the input voltage Vin (caused by factors such as manufacturing process, temperature, voltage, and so on) on the oscillating circuit 150. At the same time, the filtering circuit 140 does not affect the first current supply circuit 120 with a weaker current driving ability. Therefore, the variation of the input voltage Vin will be promptly reflected on the output of the oscillating circuit 150 through the change of the first output current Io1, but the smaller first output current Io1 does not excessively impact the oscillating circuit 150.

In some embodiments, the first input transistor MI1 includes a high voltage terminal, a control terminal, and a low voltage terminal. The high voltage terminal of the first input transistor MI1 is configured to receive the power supply voltage VDD. The control terminal of the first input transistor MI1 is configured to receive the output voltage Vop. The low voltage terminal of the first input transistor MI1 is configured to output the input current Iin.

In some embodiments, the operational amplifier OP includes an inverting terminal, a non-inverting terminal, and an output terminal. The inverting terminal of the operational amplifier OP is configured to receive the input voltage Vin. The non-inverting terminal of the operational amplifier OP is coupled to the low voltage terminal (e.g., the lower terminal) of the first input transistor MI1, and configured to receive the feedback voltage Vfb. The output terminal of the operational amplifier OP is coupled to the control terminal of the first input transistor MI1, and configured to output the output voltage Vop. In some embodiments, the output terminal of the operational amplifier OP is coupled to the second current supply circuit 130 through the filtering circuit 140.

In some embodiments, the input circuit 110 further includes a second input transistor MI2. The second input transistor MI2 includes a high voltage terminal, a control terminal, and a low voltage terminal. The high voltage terminal (e.g., the upper terminal) of the second input transistor MI2 is coupled to the low voltage terminal (e.g., the lower terminal) of the first input transistor MI1 and the non-inverting terminal of the operational amplifier OP. The control terminal of the second input transistor MI2 is coupled to its high voltage terminal (e.g., the upper terminal) to form an equivalent diode. The low voltage terminal of the second input transistor MI2 is coupled to a low potential terminal (e.g., the ground terminal). As shown in the figure, the input circuit 110 of the voltage-controlled oscillator 100 is equipped only with a transistor and not equipped with a resistor. Therefore, in circuit design, only the impact of the transistor on the corner frequency needs to be considered, without the need to consider the influence of the resistor. This complexity of the circuit design therefore decreases.

In some embodiments, the second input transistor MI2 of the input circuit 110 can be replaced with a resistor or can be implemented by a transistor operating in its linear region to improve the linearity of the gain (KVCO) of the voltage-controlled oscillator 100.

In some embodiments, the first current supply circuit 120 includes a first output transistor Mo1. The first output transistor Mo1 includes a high voltage terminal, a control terminal, and a low voltage terminal. The high voltage terminal of the first output transistor Mo1 is configured to receive the power supply voltage VDD. The control terminal of the first output transistor Mo1 is coupled to the output terminal of the operational amplifier OP, and configured to receive the output voltage Vop. The low voltage terminal of the first output transistor Mo1 is configured to generate the first output current Io1.

In some embodiments, the second current supply circuit 130 includes a second output transistor Mo2. The second output transistor Mo2 includes a high voltage terminal, a control terminal, and a low voltage terminal. The high voltage terminal of the second output transistor Mo2 is configured to receive the power supply voltage VDD. The control terminal of the second output transistor Mo2 is coupled to the output terminal of the operational amplifier OP through the filtering circuit 140, and configured to receive the output voltage Vop. The low voltage terminal of the second output transistor Mo2 is configured to generate the second output current Io2.

In some embodiments, the first input transistor MI1 and the first output transistor Mo1 form a current mirror. Based on the principles of the current mirror, the current ratio between the first output current Io1 flowing through the first output transistor Mo1 and the input current Iin flowing through the first input transistor MI1 is a specific value (such as a fixed value, or one of several predetermined ratios of a controllable current mirror). By determining the size ratio or equivalent relationship of the first output transistor Mo1 and the first input transistor MI1 (such as the ratio of the number of transistors in the first output transistor Mo1 to the number of transistors in the first input transistor MI1), the current ratio Io1/Iin can be determined.

As mentioned above, the first input transistor MI1 and the second output transistor Mo2 also form a current mirror. Based on the principles of the current mirror, the current ratio between the second output current Io2 flowing through the second output transistor Mo2 and the input current Iin flowing through the first input transistor MI1 is a specific value (such as a fixed value, or one of several predetermined ratios of a controllable current mirror). By determining the size ratio or equivalent relationship of the second output transistor Mo2 and the first input transistor MI1 (such as the ratio of the number of transistors in the second output transistor Mo2 to the number of transistors in the first input transistor MI1), the current ratio Io2/Iin can be determined. As a result, the voltage-controlled oscillator 100 of present disclosure utilizes the negative feedback mechanism of the operational amplifier OP to adjusts the gate-source voltage (Vgs) of the first input transistor MI1 with lower input voltage Vin. Simultaneously, it adjusts the currents of the first output transistor Mo1 and the second output transistor Mo2 through the principles of the current mirror. In view of the above, the voltage-controlled oscillator 100 of the present disclosure controls the first output transistor Mo1 and the second output transistor Mo2 through the negative feedback mechanism of the operational amplifier OP. In other words, the gate voltages of the first output transistor Mo1 and the second output transistor Mo2 are determined by the operational amplifier OP. Therefore, the voltage-controlled oscillator 100 of the present disclosure has superior power supply rejection ratio (PSRR), and therefore requirements of the power supply is lower.

In some embodiments, the first input transistor MI1, the first output transistor Mo1, and the second output transistor Mo2 can be P-type Metal-Oxide-Semiconductor Field-Effect Transistors (PMOSFET), and the second input transistor MI2 can be N-type Metal-Oxide-Semiconductor Field-Effect Transistor (NMOSFET). However, the present disclosure is not limited to the embodiment in FIG. 1, the types of the first input transistor MI1, the second input transistor MI2, the first output transistor Mo1, and the second output transistor Mo2 can be changed by actual requirements. In addition, the high voltage terminal and the low voltage terminal as mentioned in the previous embodiment can be the source terminal and the drain terminal of the PMOSFET respectively, the high voltage terminal and the low voltage terminal can be the drain terminal or the source terminal of the NMOSFET respectively, and the control terminal can be the gate terminal of both of the PMOSFET and NMOSFET.

In some embodiments, the filtering circuit 140 includes a capacitor C1 and a resistor R1. The capacitor C1 is configured to receive the power supply voltage VDD. The resistor R1 is coupled to the output terminal of the operational amplifier OP, the control terminal of the first input transistor MI1, the control terminal of the first output transistor Mo1, and the control terminal of the second output transistor Mo2.

In some embodiments, the resistor R1 includes a first terminal and a second terminal. The first terminal (e.g., the left terminal) of the resistor R1 is coupled to the output terminal of the operational amplifier OP, and the second terminal (e.g., the right terminal) of the resistor R1 is coupled to the capacitor C1 and the control terminal of the second output transistor Mo2.

In some embodiments, the filtering circuit 140 can be a passive low-pass filter. In another embodiment, the filtering circuit 140 can also be an active low-pass filter composed of capacitors and operational amplifiers. When the voltage-controlled oscillator 100 is in a steady state, the filtering circuit 140 will filter out the medium high frequency noise. Equivalently, the effective gain (KVCO) of the voltage-controlled oscillator 100 is smaller.

In some embodiments, the oscillating circuit 150 includes a ring oscillator, the ring oscillator include a plurality of oscillator units, and each of the oscillator units (e.g., inverters) is driven by the first output current Io1 and the second output current Io2 to generate a clock according to the output of the oscillator unit of the preceding stage.

Figure 2:
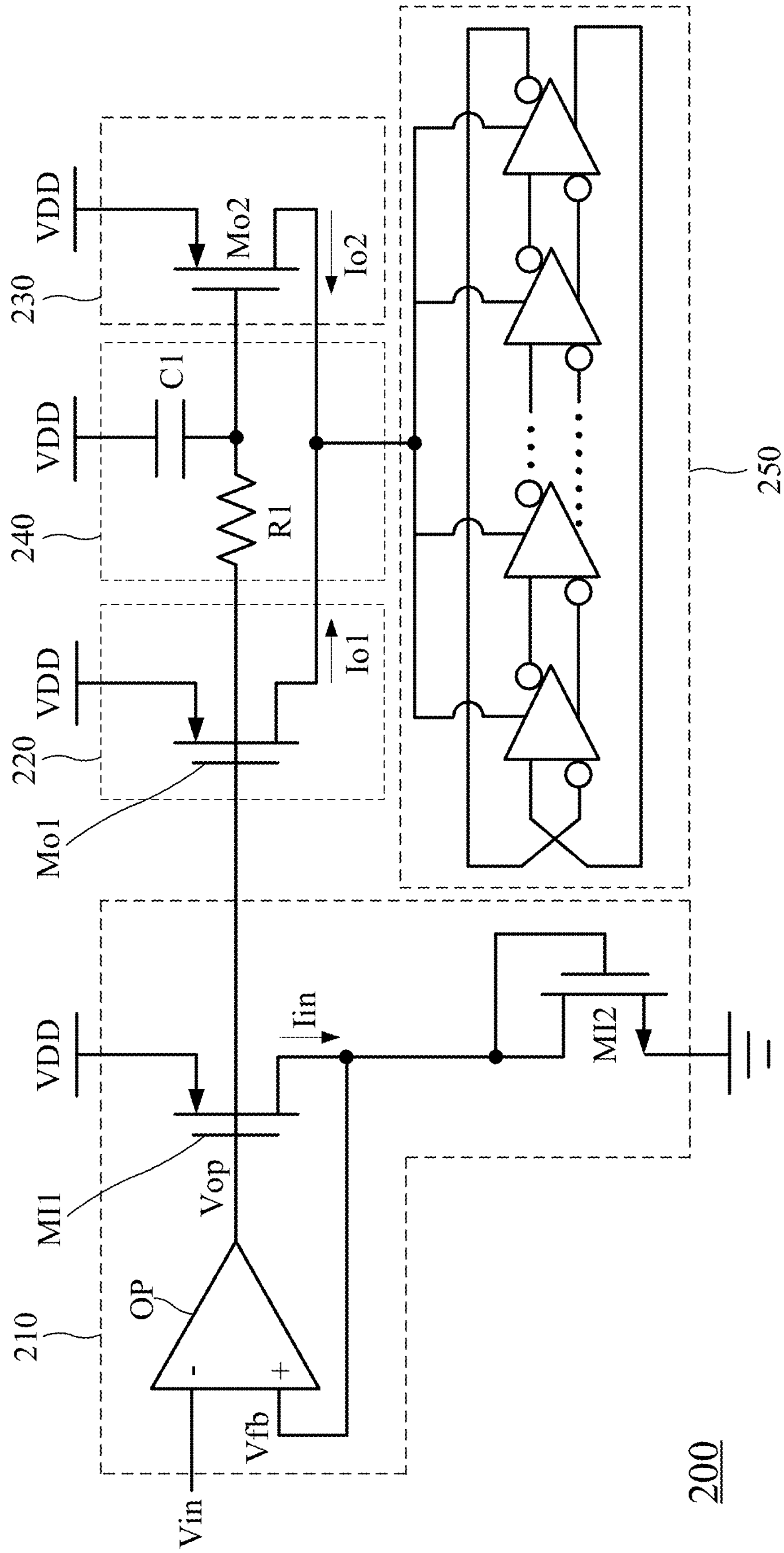
FIG. 2 shows an embodiment of a voltage-controlled oscillator of the present disclosure.

In some embodiments, the oscillation circuit 150 can be a single-ended oscillator. However, the present disclosure is not limited to the embodiment in FIG. 1. In other embodiments, as shown in FIG. 2, the oscillation circuit 250 of the present disclosure may also utilize a differential oscillator depending on actual requirements. It is noted that, only the oscillation circuit 250 in FIG. 2 is different from the oscillation circuit 150 in FIG. 1, the structures and the operations of the remaining input circuit 210, the first current supply circuit 220, the second current supply circuit 230, and the filtering circuit 240 in FIG. 2 are similar to those of the input circuit 110, the first current supply circuit 120, the second current supply circuit 130, and the filtering circuit 140 in FIG. 1. Therefore, detailed descriptions regarding the remaining circuits in FIG. 2 are omitted here.

Figure 3:
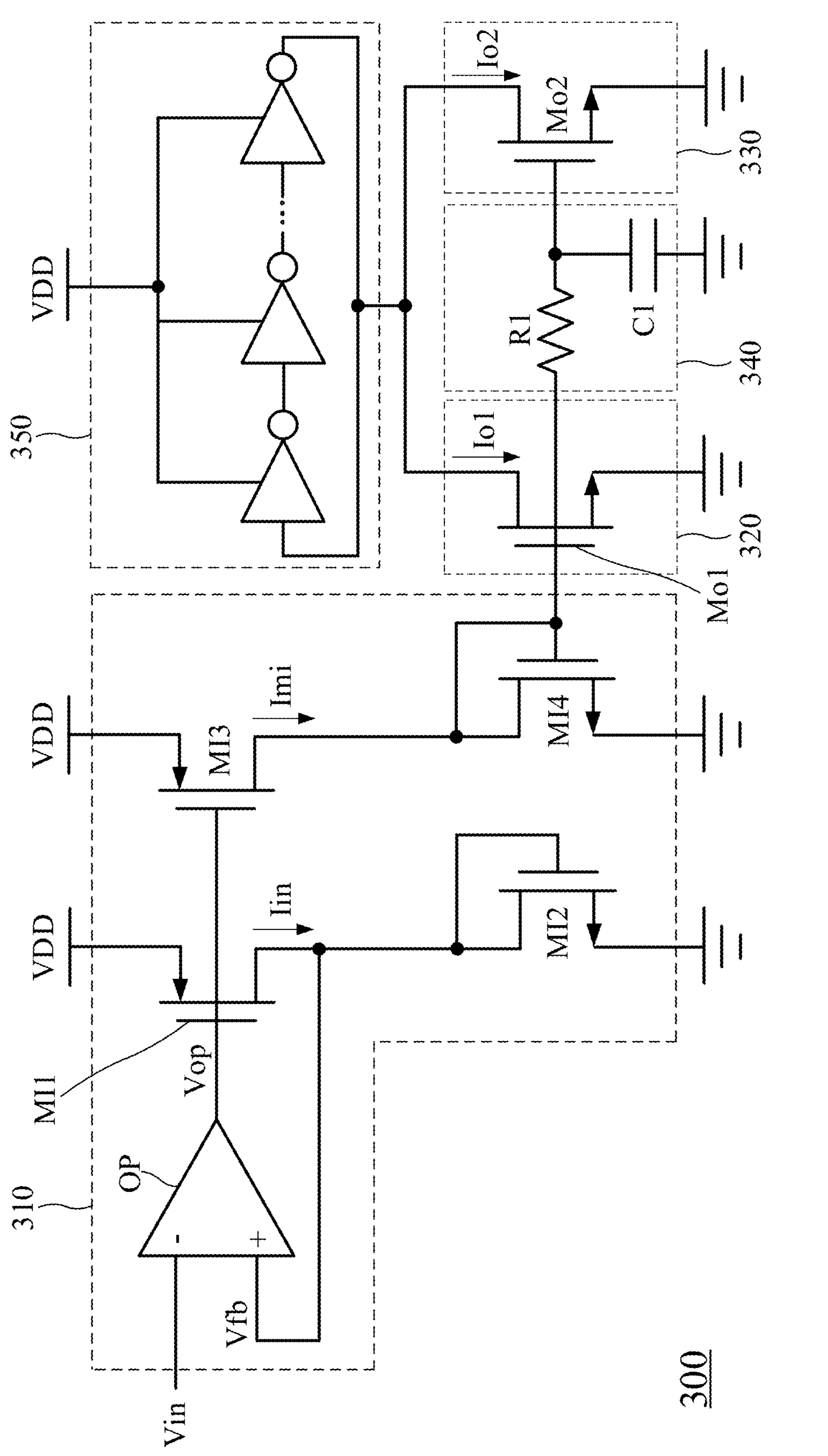
FIG. 3 shows an embodiment of a voltage-controlled oscillator of the present disclosure.

FIG. 3 shows an embodiment of a voltage-controlled oscillator 300 of the present disclosure. Compared with utilizing PMOSFETs in the first current supply circuit 120 and the second current supply circuit 130 of the voltage-controlled oscillator 100 in FIG. 1, the first current supply circuit 320 and the second current supply circuit 330 of the voltage-controlled oscillator 300 in FIG. 3 utilize NMOSFETs. To accommodate the foregoing adjustment, the structures and the operations of the voltage-controlled oscillator 300 in FIG. 3 differ from those of the voltage-controlled oscillator 100 in FIG. 1, which will be explained in detail as below.

In some embodiments, compared with the input circuit 110 in FIG. 1, the input circuit 310 in FIG. 3 further includes a third input transistor MI3. The third input transistor MI3 is configured to generate a mirror current Imi according to the input current Iin. In some embodiments, the third input transistor MI3 includes a high voltage terminal, a control terminal, and a low voltage terminal. The high voltage terminal of the third input transistor MI3 is configured to receive the power supply voltage VDD. The control terminal of the third input transistor MI3 is coupled to the output terminal of the operational amplifier OP, and configured to receive the output voltage Vop. The low voltage terminal of the third input transistor MI3 is configured to output the mirror current Imi.

In some embodiments, compared with the input circuit 110 in FIG. 1, the input circuit 310 in FIG. 3 further includes a fourth input transistor MI4. The fourth input transistor MI4 includes a high voltage terminal, a control terminal, and a low voltage terminal. The high voltage terminal of the fourth input transistor MI4 is coupled to the low voltage terminal (e.g., the lower terminal) of the third input transistor MI3. The control terminal of the fourth input transistor MI4 is coupled to its high voltage terminal to form an equivalent diode. The low voltage terminal of the fourth input transistor MI4 is coupled to the low potential terminal (e.g., the ground terminal).

In some embodiments, the first current supply circuit 320 includes a first output transistor Mo1. The first output transistor Mo1 includes a high voltage terminal, a control terminal, and a low voltage terminal. The high voltage terminal of the first output transistor Mo1 is coupled to the oscillating circuit 350. The control terminal of the first output transistor Mo1 is coupled to the low voltage terminal (e.g., the lower terminal) of the third input transistor MI3 and the high voltage terminal (e.g., the upper terminal) of the fourth input transistor MI4. The low voltage terminal of the first output transistor Mo1 is coupled to the low potential terminal (e.g., the ground terminal). Compared with utilizing PMOSFET in the first output transistor Mo1 of the first current supply circuit 120 in FIG. 1, the first output transistor Mo1 of the first current supply circuit 320 in FIG. 3 utilizes NMOSFET.

In some embodiments, the second current supply circuit 330 includes a second output transistor Mo2. The second output transistor Mo2 includes a high voltage terminal, a control terminal, and a low voltage terminal. The high voltage terminal of the second output transistor Mo2 is coupled to the oscillating circuit 350. The control terminal of the second output transistor Mo2 is coupled to the low voltage terminal (e.g., the lower terminal) of the third input transistor MI3 and the high voltage terminal (e.g., the upper terminal) of the fourth input transistor MI4 through the filtering circuit 340. The low voltage terminal of the second output transistor Mo2 is coupled to the low potential terminal (e.g., the ground terminal). Compared with utilizing PMOSFET in the second output transistor Mo2 of the second current supply circuit 130 in FIG. 1, the second output transistor Mo2 of the second current supply circuit 330 in FIG. 3 utilizes NMOSFET.

In some embodiments, compared with the filtering circuit 140 in FIG. 1, the capacitor C1 of the filtering circuit 340 in FIG. 3 is coupled to the low potential terminal (e.g., the ground terminal). The resistor R1 of the filtering circuit 340 is coupled to the low voltage terminal (e.g., the lower terminal) of the third input transistor MI3, the high voltage terminal (e.g., the upper terminal) of the fourth input transistor MI4, the control terminal of the fourth input transistor MI4, and the control terminal of the first output transistor Mo1, and coupled to the control terminal of the second output transistor Mo2.

In some embodiments, compared with the filtering circuit 140 in FIG. 1, the first terminal (e.g., the left terminal) of the resistor R1 of the filtering circuit 340 in FIG. 3 is coupled to the low voltage terminal (e.g., the lower terminal) of the third input transistor MI3 and the high voltage terminal (e.g., the upper terminal) of the fourth input transistor M14. The second terminal (e.g., the right terminal) of the resistor R1 of the filtering circuit 340 is coupled to the capacitor C1 and the control terminal of the second output transistor Mo2. In some embodiments, compared with the oscillating circuit 150 in FIG. 1, one terminal of the oscillating circuit 350 in FIG. 3 is configured to receive the power supply voltage VDD, and another terminal of the oscillating circuit 350 is coupled to the high voltage terminal (e.g., the upper terminal) of the first output transistor Mo1 and the high voltage terminal (e.g., the upper terminal) of the second output transistor Mo2.

Figure 4:
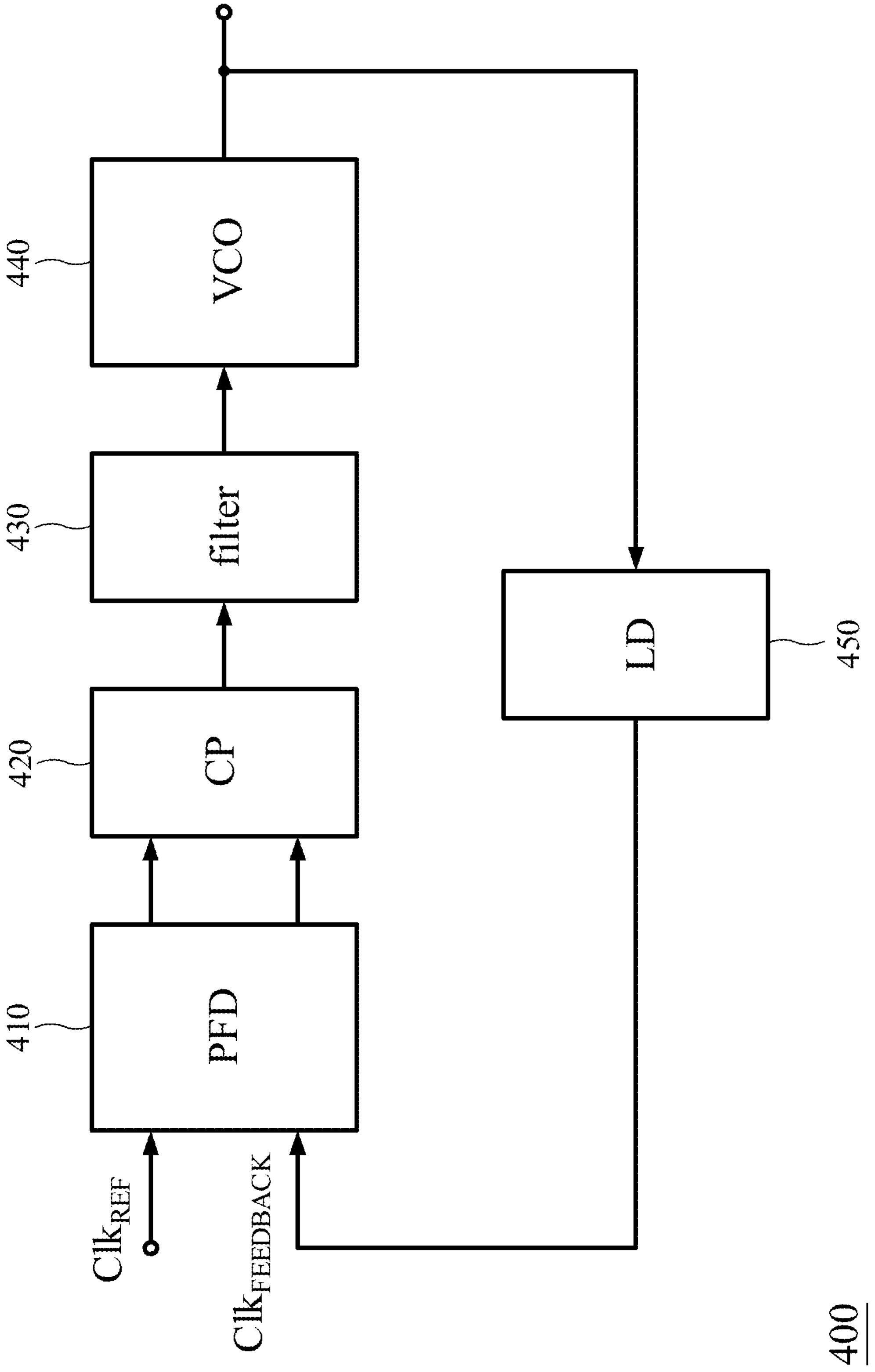
FIG. 4 shows an embodiment of a phase-locked loop of the present disclosure.

Except for the voltage-controlled oscillators 100, 200, 300, the present disclosure also includes a phase-locked loop. FIG. 4 shows an embodiment of a phase-locked loop 400 of the present disclosure. The phase-locked loop 400 in FIG. 4 includes a phase frequency detector (PFD) 410, a charge pump (CP) 420, a filtering circuit (filter) 430, a voltage-controlled oscillator (VCO) 440, and a loop divider (LD) 450.

In some embodiments, the phase-frequency detector 410 is configured to detect a difference between a reference clock ClkREF and a feedback clock ClkFEEDBACK to output a detection signal. The charge pump 420 is configured to generate a charging/discharging signal according to the detection signal. The filtering circuit 430 is configured to determine an input voltage according to the charging/discharging signal. The voltage-controlled oscillator 440 is configured to generate an output clock according to the input voltage. The loop divider 450 is configured to generate the feedback clock $Clk_{FEEDBACK}$ according to the output clock. Each of the phase-frequency detector 410, the charge pump 420, the filtering circuit 430, and the loop divider 450 is a known circuit or a self-developed circuit, and thus the detail of these circuits is omitted. The voltage-controlled oscillator 440 can be one of the voltage-controlled oscillators 100, 200, 300 of FIG. 1~FIG. 3 or the equivalent circuit thereof. It is noted that, in the embodiment of FIG. 4, a ratio of a filter bandwidth of the filtering circuit (e.g., one of the filters 140, 240, 340 in FIG. 1~FIG. 3) of the voltage-controlled oscillator 440 to a loop bandwidth of the phase-locked loop 400 can be optionally set to be not greater than 0.01 so as to achieve better performance.

Since people of ordinary skill in the art can appreciate the detail and the modification of the embodiment of FIG. 4 by referring to the disclosure of the embodiments of FIGS. 1~3, which means that each feature of the embodiments of FIGS. 1~3 can be applied to the embodiment of FIG. 4 in a reasonable way, repeated and redundant description having little to do with the requirements of written description and enablement is omitted here.

In view of the above, the voltage-controlled oscillator and the phase-locked loop of some embodiments of the present disclosure exhibit a smaller effective gain (KVCO) and superior phase noise. Consequently, the loop filter can utilize a smaller compensation capacitor, which reduces both area and cost.

Additionally, the voltage-controlled oscillator of the present disclosure utilizes the operational amplifier to receive the input voltage. Through the negative feedback mechanism of the operational amplifier, low input voltage can be used to adjust the transistor for generating the current to control the oscillating frequency of the oscillator. As a result, the voltage-controlled oscillator of the present disclosure has a wider input voltage range, and the phase-locked loop utilizing the voltage-controlled oscillator has a broader voltage operating range as well.

Besides, the voltage-controlled oscillator and the phase-locked loop of the present disclosure utilize the negative feedback mechanism of the operational amplifier to adjust the transistor. Consequently, the voltage-controlled oscillator and the phase-locked loop of the present disclosure have a superior power supply rejection ratio (PSRR), and requirements to the power supply are therefore lower. Furthermore, in the circuit design of the voltage-controlled oscillator and the phase-locked loop of the present disclosure, only the impact of the transistor on the corner frequency needs to be considered, without the need to account for the influence of the resistor. As a result, the complexity of the circuit design decreases.

It is noted that people having ordinary skill in the art can selectively use some or all of the features of any embodiment in this specification or selectively use some or all of the features of multiple embodiments in this specification to implement the present invention as long as such implementation is practicable; in other words, the way to implement the present invention can be flexible based on the present disclosure.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A voltage-controlled oscillator, comprising:
- an input circuit, comprising:
  - an operational amplifier, configured to generate an output voltage according to an input voltage and a feedback voltage;
  - a first input transistor, configured to generate an input current according to the output voltage and a power supply voltage;
  - a second input transistor, comprising:
    - a high voltage terminal, coupled to a low voltage terminal of the first input transistor and a non-inverting terminal of the operational amplifier;
    - a control terminal, coupled to the high voltage terminal of the second input transistor; and
    - a low voltage terminal, coupled to a low potential terminal; and
  - a third input transistor, configured to generate a mirror current according to the input current;
- a first current supply circuit, configured to generate a first output current according to the input current;
- a second current supply circuit, configured to generate a second output current according to the input current;
- a filtering circuit, coupled to the input circuit and the second current supply circuit, and configured to reduce an influence caused by a variation of the input current on the second current supply circuit; and
- an oscillating circuit, configured to generate an output clock according to the first output current and the second output current.

2. The voltage-controlled oscillator of claim 1, wherein the second output current is larger than the first output current.

3. The voltage-controlled oscillator of claim 1, wherein a ratio of the second output current to the first output current is a value ranging from 10 to 40.

4. The voltage-controlled oscillator of claim 1, wherein the first input transistor comprises:
- a high voltage terminal, configured to receive the power supply voltage;
- a control terminal, configured to receive the output voltage; and
- the low voltage terminal, configured to output the input current.

5. The voltage-controlled oscillator of claim 1, wherein the operational amplifier comprises:
- an inverting terminal, configured to receive the input voltage;
- the non-inverting terminal, coupled to the low voltage terminal of the first input transistor, and configured to receive the feedback voltage; and
- an output terminal, coupled to a control terminal of the first input transistor, and configured to output the output voltage.

6. The voltage-controlled oscillator of claim 1, wherein the third input transistor comprises:
- a high voltage terminal, configured to receive the power supply voltage;
- a control terminal, coupled to an output terminal of the operational amplifier, and configured to receive the output voltage; and
- a low voltage terminal, configured to output the mirror current.

7. The voltage-controlled oscillator of claim 6, wherein the input circuit further comprises:
- a fourth input transistor, comprising:
  - a high voltage terminal, coupled to the low voltage terminal of the third input transistor;
  - a control terminal, coupled to the high voltage terminal of the fourth input transistor; and
  - a low voltage terminal, coupled to the low potential terminal.

8. The voltage-controlled oscillator of claim 7, wherein the first current supply circuit comprises:
- a first output transistor, comprising:
  - a high voltage terminal, coupled to the oscillating circuit;

a control terminal, coupled to the low voltage terminal of the third input transistor and the high voltage terminal of the fourth input transistor; and a low voltage terminal, coupled to the low potential terminal.

9. The voltage-controlled oscillator of claim 8, wherein the second current supply circuit comprises:

a second output transistor, comprising:

a high voltage terminal, coupled to the oscillating circuit;

a control terminal, coupled to the low voltage terminal of the third input transistor and the high voltage terminal of the fourth input transistor through the filtering circuit; and a low voltage terminal, coupled to the low potential terminal.

10. The voltage-controlled oscillator of claim 9, wherein the filtering circuit comprises:

a capacitor, coupled to the low potential terminal; and a resistor, coupled to the low voltage terminal of the third input transistor and the high voltage terminal of the fourth input transistor, and coupled to the control terminal of the second output transistor.

11. The voltage-controlled oscillator of claim 10, wherein the resistor comprises:

a first terminal, coupled to the low voltage terminal of the third input transistor and the high voltage terminal of the fourth input transistor; and a second terminal, coupled to the capacitor and the control terminal of the second output transistor.

12. A phase-locked loop, comprising:

a phase-frequency detector, configured to detect a difference between a reference clock and a feedback clock to output a detection signal;

a charge pump, configured to generate a charging/discharging signal according to the detection signal;

a first filtering circuit, configured to determine an input voltage according to the charging/discharging signal;

a voltage-controlled oscillator, comprising:

an input circuit, comprising:

an operational amplifier, configured to generate an output voltage according to the input voltage and a feedback voltage;

a first input transistor, configured to generate an input current according to the output voltage and a power supply voltage;

a second input transistor, comprising:

a high voltage terminal, coupled to a low voltage terminal of the first input transistor and a non-inverting terminal of the operational amplifier;

a control terminal, coupled to the high voltage terminal of the second input transistor; and a low voltage terminal, coupled to a low potential terminal; and a third input transistor, configured to generate a mirror current according to the input current;

a first current supply circuit, configured to generate a first output current according to the input current;

a second current supply circuit, configured to generate a second output current according to the input current;

a second filtering circuit, coupled to the input circuit and the second current supply circuit, and configured to reduce an influence caused by a variation of the input current on the second current supply circuit; and an oscillating circuit, configured to generate an output clock according to the first output current and the second output current; and a loop divider, configured to generate the feedback clock according to the output clock, wherein a ratio of a filter bandwidth of the second filtering circuit to a loop bandwidth of the phase-locked loop is not larger than 0.01.

13. The phase-locked loop of claim 12, wherein the second output current is larger than the first output current.

* * * * *